United States Patent
Higashino et al.

(10) Patent No.: US 8,111,350 B2
(45) Date of Patent: Feb. 7, 2012

(54) SEMICONDUCTOR LIGHT-EMITTING DEVICE AND FABRICATION METHOD THEREOF

(75) Inventors: Jiro Higashino, Machida (JP); Ji-Hao Liang, Kawasaki (JP); Takako Chinone, Tokyo (JP); Yasuyuki Shibata, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/005,710

(22) Filed: Jan. 13, 2011

(65) Prior Publication Data

US 2011/0175105 A1 Jul. 21, 2011

(30) Foreign Application Priority Data

Jan. 15, 2010 (JP) ................................ 2010-007154

(51) Int. Cl.
 *G02F 1/1335* (2006.01)
(52) U.S. Cl. ................ 349/61; 349/56; 349/62
(58) Field of Classification Search ............ 349/56, 349/61, 62
See application file for complete search history.

(56) References Cited

U.S. PATENT DOCUMENTS

| | | | | |
|---|---|---|---|---|
| 6,777,621 B2 * | 8/2004 | Ishikawa et al. | ............. | 174/260 |
| 6,870,191 B2 | 3/2005 | Niki et al. | | |
| 7,635,875 B2 | 12/2009 | Niki et al. | | |
| 7,683,386 B2 * | 3/2010 | Tanaka et al. | ................... | 257/88 |
| 7,745,245 B2 | 6/2010 | Niki et al. | | |
| 7,804,101 B2 | 9/2010 | Niki et al. | | |
| 2009/0136877 A1 * | 5/2009 | Suganuma | ................... | 430/325 |

FOREIGN PATENT DOCUMENTS

JP 2003-318441 A 11/2003

* cited by examiner

*Primary Examiner* — Jennifer Doan
(74) *Attorney, Agent, or Firm* — Holtz, Holtz, Goodman & Chick, PC

(57) ABSTRACT

A plurality of protrusions is formed on the C-plane substrate with a corundum structure. A base film made of a III-V compound semiconductor including Ga and N is formed on the surface of the substrate. The surface of the base film is flatter than the surface of the substrate. A light emitting structure including Ga and N is disposed on the base film. The protrusions are regularly arranged in a first direction that is tilted by less than 15 degrees with respect to the a-axis of the base film and in a second direction that is orthogonal to the first direction. Each protrusion has two first parallel sides tilted by less than 15 degrees relative to an m-axis and two second parallel sides tilted by less than 15 degrees relative to the a-axis. An interval between the two second sides is wider than an interval between the two first sides.

5 Claims, 13 Drawing Sheets

SEMICONDUCTOR LIGHT-EMITTING DEVICE AND FABRICATION METHOD THEREOF

FIELD

The present invention relates to a semiconductor light-emitting device including Ga and N in a light-emitting layer and to a method of fabricating the semiconductor light-emitting device.

BACKGROUND

In the technology proposed in Japanese Unexamined Patent Application Publication No. 2003-318441, recesses and protrusions are formed on the surface of a sapphire substrate and a semiconductor light-emitting layer is then formed on the uneven surface. The uneven surface is shaped so that crystal defects are not caused in the semiconductor light-emitting layer. Since light emitted from the light-emitting layer scatters or diffracts on the uneven surface, high external quantum efficiency is obtained.

SUMMARY

When a GaN layer is grown on the surface of a sapphire substrate having recesses and protrusions, films growing from the top surfaces of the protrusions and films growing from the bottom surfaces of the recesses are combined, resulting in a film having a flat surface. To obtain a flat surface, the films growing from the top surfaces of the protrusions and the films growing from the bottom surfaces of the recesses must be combined and a GaN layer must continue to grow until a flat state is obtained. If the time during which these films grow is insufficient, some recesses and protrusions are left on the surface of the GaN layer.

An object of the present invention is to provide a semiconductor light-emitting device that shortens a growing time taken until the surface of a film formed on a substrate having recesses and protrusions is flattened and to provide a method of fabricating a semiconductor light-emitting device of this type.

According to one aspect of the present invention, there is provided a semiconductor light-emitting device, comprising:
  a substrate having a corundum crystal structure that has a c-axis facing in a thickness direction, a plurality of protrusions being formed on a surface of the substrate;
  a base film formed on the surface of the substrate, on which the plurality of protrusions are formed, the base film being made of a III-V compound semiconductor including Ga and N, a surface of the base film being flatter than the surface of the substrate; and
  a light emitting structure, formed on the base film, that includes an n-type semiconductor layer and a p-type semiconductor layer, which are made of III-V compound semiconductors including Ga and N;
  wherein when a direction that is tilted by less than 15 degrees with respect to an a-axis of the base film is designated as a first direction and another direction orthogonal to the first direction is designated as a second direction,
  the protrusions are regularly arranged, in the first direction and the second direction, a planar shape of each protrusion having edges matching the four sides of a quadrangle, the quadrangle having a pair of first sides tiled by less than 15 degrees with respect to an m-axis of the base film and a pair of second sides tilted by less than 15 degrees with respect to the a-axis of the base film,
  the first sides, which face each other, of quadrangles matching two adjacent protrusions in the first direction are mutually parallel, and the second sides, which face each other, of the quadrangles corresponding to two adjacent protrusions in the second direction are mutually parallel, an interval between the two second sides, which face each other, in the m-axis direction being wider than an interval between the two first sides, which face each other, in the a-axis direction.

According to another aspect of the present invention, there is provided a method of fabricating a semiconductor light-emitting device, comprising the steps of:
  forming a plurality of protrusions on a surface of a substrate by partially etching a surface layer of the substrate, the substrate having a corundum crystal structure, a c-axis of which faces in a thickness direction;
  forming a base film on the surface of the substrate, on which the plurality of protrusions are formed, the base film being made of a III-V compound semiconductor including Ga and N;
  forming a light emitting structure, on the base film, that includes an n-type semiconductor layer and a p-type semiconductor layer, which are made of III-V compound semiconductors including Ga and N;
  wherein when a direction that is tilted by less than 15 degrees with respect to an a-axis of the base film is designated as a first direction and another direction orthogonal to the first direction is designated as a second direction,
  the protrusions are regularly arranged, in the first direction and the second direction, a planar shape of each protrusion having edges matching the four sides of a quadrangle, the quadrangle having a pair of first sides tilted by less than 15 degrees with respect to an m-axis of the base film and a pair of second sides tilted by less than 15 degrees with respect to the a-axis of the base film,
  the first sides, which face each other, of quadrangles corresponding to the two adjacent protrusions in the first direction are mutually parallel, and the second sides, which face each other, of the quadrangles corresponding to the two adjacent protrusions in the second direction are mutually parallel, an interval between the two second sides, which face each other, in the m-axis direction being wider than an interval between the two first sides, which face each other, in the a-axis direction.

BRIEF DESCRIPTION OF THE DRAWINGS

FIGS. 1B to 1H are plane views of uneven patterns of individual samples;

DESCRIPTION OF EMBODIMENTS

Tests carried out by the inventors of this application and their results are first described before embodiments of the present invention are described.

Figure 1A:
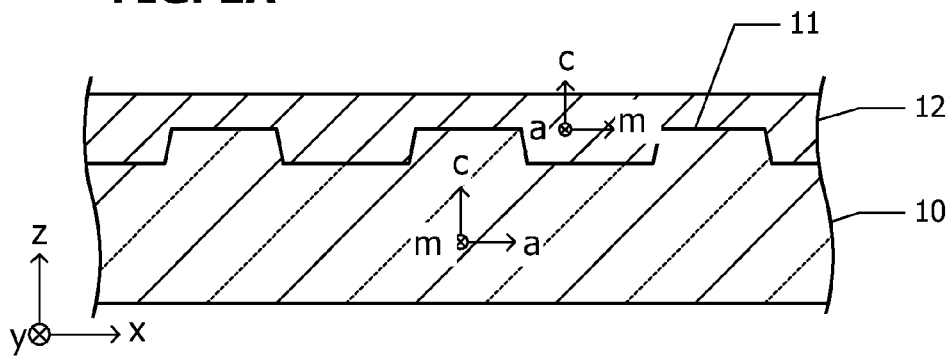
FIG. 1A is a cross sectional view of a sample under test.
Figure 1A:
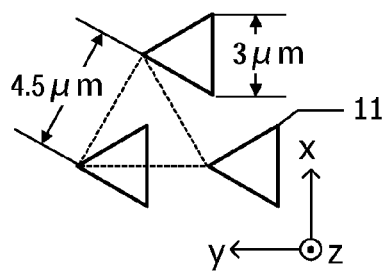
Figure 1A:
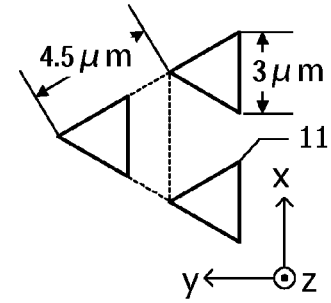
Figure 1A:
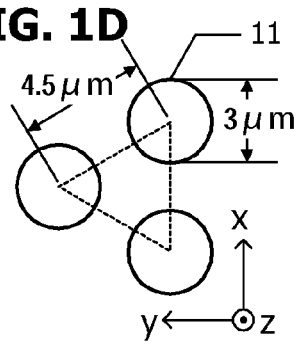
Figure 1A:
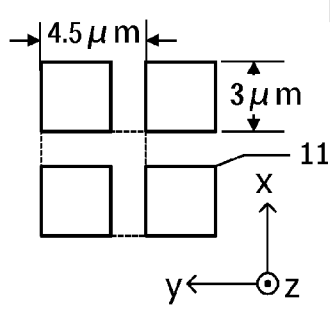
Figure 1A:
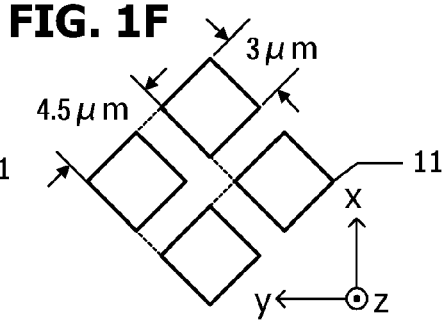
Figure 1A:
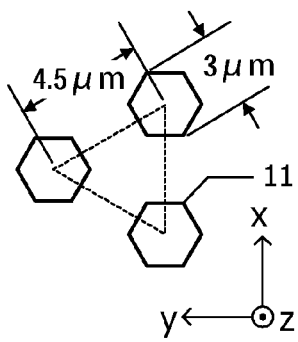
Figure 1A:
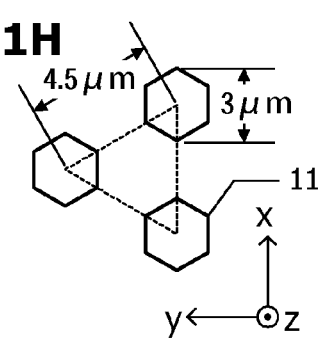

A plurality of samples were prepared by growing a GaN layer 12 on a C-plane sapphire single crystal substrate 10 having a plurality of protrusions 11 on its surface by using the metal organic chemical vapor deposition (MOCVD) method, as shown in FIG. 1A. The sapphire single crystal constituting the substrate 10 has a corundum structure. The thickness direction of the substrate 10 is parallel to the c-axis of the sapphire single crystal. An xyz orthogonal coordinate system is defined in which the a-axis direction of the sapphire single crystal substrate 10 corresponds to the x-axis, its m-axis direction corresponds to the y-axis, and its c-axis direction corresponds to the z-axis. The a-axis of the GaN layer 12 faces a direction rotated by 30 degrees from the a-axis of the substrate 10. Therefore, The a-axis and m-axis of the GaN film 12 are respectively parallel to the y-axis and x-axis.

FIGS. 1B to 1H show the shapes and distributions of protrusions 11. For the samples shown in FIGS. 1B and 1C, the planar shape of each protrusion 11 is a regular triangle, each side of which is 3 μm long, one side being parallel to the x-axis. For the sample shown in FIG. 1D, the planar shape of each protrusion 11 is a circle with a diameter of 3 μm. For the samples shown in FIGS. 1E and 1F, the planar shape of each protrusion 11 is a square, each side of which is 3 μm long. Two sides of each protrusion 11 of the sample shown in FIG. 1E are parallel to the y-axis, and two sides of each protrusion 11 of the sample shown in FIG. 1F are parallel to a line at 45 degrees to the x-axis. For the samples shown in FIGS. 1G and 1H, the planar shape of each protrusion 11 is a regular hexagon, the circumscribed circle of which has a diameter of 3 μm. Two sides of each protrusion 11 of the sample shown in FIG. 1G are parallel to the y-axis, and two sides of each protrusion 11 of the sample shown in FIG. 1H are parallel to the x-axis.

For the sample shown in FIG. 1B, the protrusions 11 are located at points corresponding to the grid points of a regular triangular grid, one of its grid lines being parallel to the y-axis. For the samples shown in FIGS. 1C, 1D, 1G, and 1H, the protrusions 11 are located at points corresponding to the grid points of a regular triangular grid, one of its grid lines being parallel to the x-axis. For the sample shown in FIG. 1E, the protrusions 11 are located at points corresponding to the grid points of a square grid, one of its grid lines being parallel to the x-axis. For the sample shown in FIG. 1F, the protrusions 11 are located at points corresponding to the grid points of a square grid, one of its grid liens at 45 degrees to the x-axis. For all samples, the interval between two adjacent grid points is 4.5 μm long.

Figure 2A:
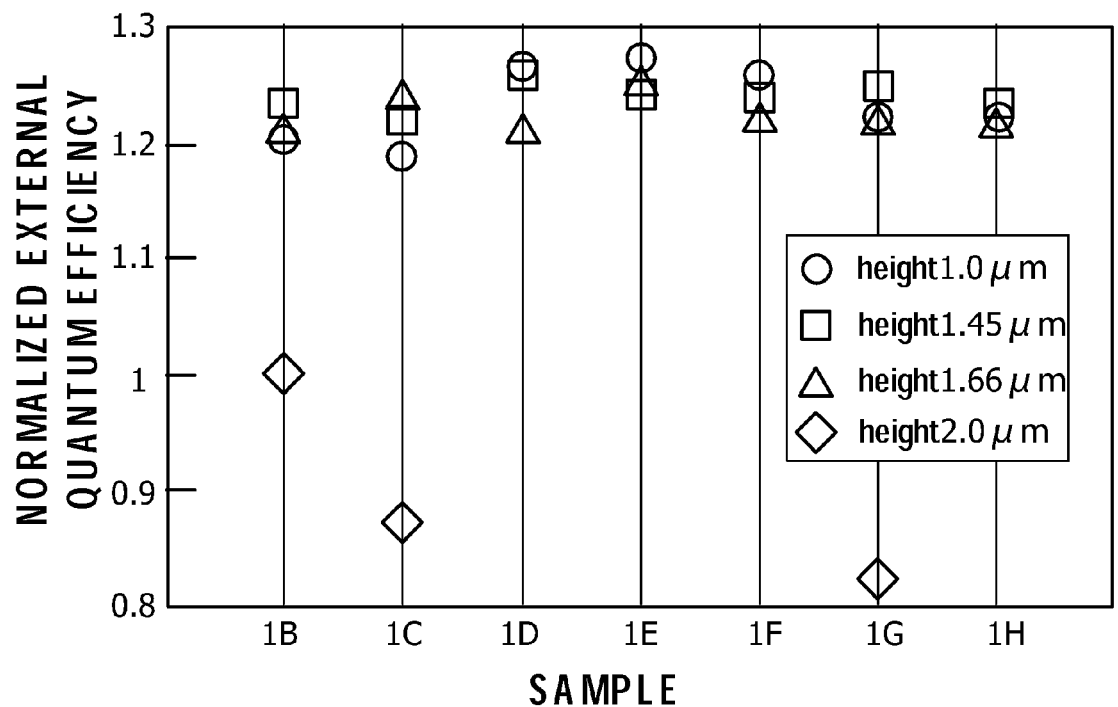
FIG. 2A is a graph indicating measured normalized external quantum efficiencies of the samples under test.
Figure 2B:
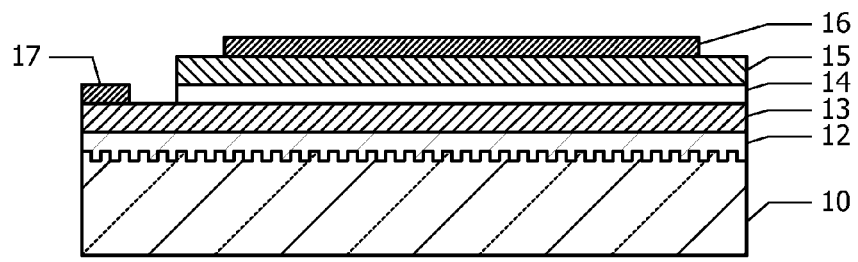
FIG. 2B is a cross sectional view of the samples.

The graph in FIG. 2A indicates external quantum efficiencies measured for a light emitting diode formed on the GaN layer 12 of each sample. FIG. 2B is a cross sectional view of the fabricated light emitting diode. An n-type GaN layer 13, a light emitting layer 14, and a p-type GaN layer 15 are laminated on the GaN film. An n-side electrode 17 is formed on part of the top surface of the n-type GaN layer 13, and a p-side electrode 16 is formed on the p-type GaN layer 15.

In FIG. 2A, the samples shown in FIGS. 1B to 1H are plotted along the horizontal axis. The vertical axis represents a normalized external quantum efficiencies, assuming that the external quantum efficiency of a light emitting diode formed on a flat sapphire substrate is 1. Each circle, square, triangle, and rhombus in FIG. 2A respectively indicate the external quantum efficiencies of light emitting diodes formed on samples having protrusions 11 with heights of 1.0 μm, 1.45 μm, 1.66 μm, and 2.0 μm.

The samples other than the sample having the protrusions 11 with a height of 2.0 μm indicate that the light emitting diodes formed thereon have a higher external quantum efficiency than the light emitting diode formed on the flat sapphire substrate. This is because the protrusions formed on the sapphire substrate 10 suppress light from being confined in the device. In particular, devices formed on the sample shown in FIG. 1E have a higher external quantum efficiency than devices on the other samples.

Figure 3:
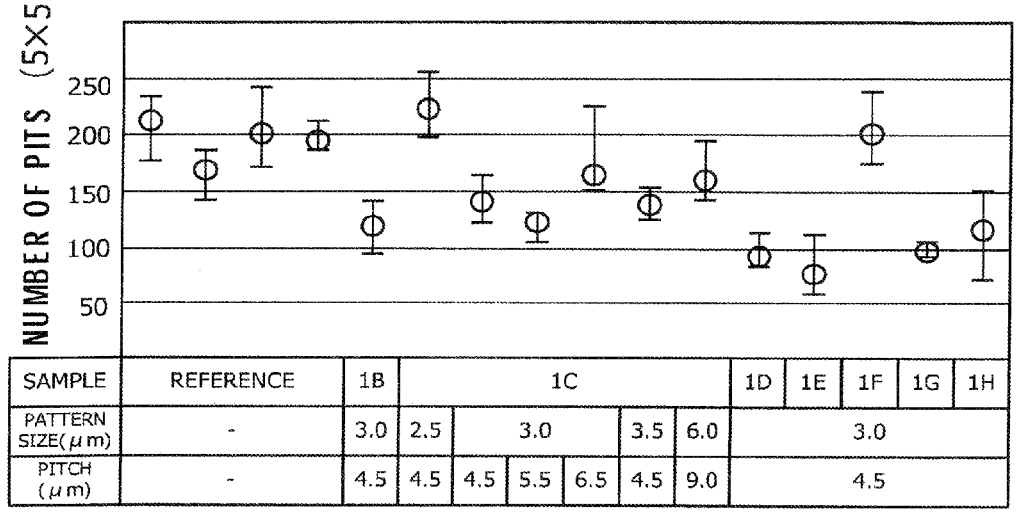
FIG. 3 is a graph indicating the number of pits measured on the GaN layer of the samples under test.

The graph in FIG. 3 indicates the number of pits counted by observing the surface of the GaN layer 12 of each sample under a scanning probe microscope (SPM). The vertical axis indicates the number of pits detected in a square measuring 5 μm×5 μm, and the horizontal axis represents samples. The reference sample was formed by growing a GaN layer on a flat sapphire substrate. Samples 1B to 1H respectively have protrusions corresponding to the shapes and arranges of the protrusions 11 shown in FIGS. 1B to 1H. The pattern size indicates a dimension of each protrusion 11. For the samples in FIGS. 1B, 1C, 1E, and 1F, the pattern size is equivalent to the length of one side of the protrusion 11; for the sample in FIG. 1D, the pattern size is equivalent to the diameter of the protrusion 11; for the samples in FIGS. 1G and 1H, the pattern size is equivalent to the diameter of the circumscribed circle of the regular hexagon. The pitch in FIG. 3 is equivalent to the interval between two adjacent grid points of the grid pattern corresponding to the arrangement of the protrusions 11.

The evaluation result shown in FIG. 3 indicates that the number of pits on the GaN layer 12 of the sample shown in FIG. 1E is smaller than the number of pits on the GaN layers 12 of the other samples, indicating that the sample in FIG. 1E has a highly crystalline GaN layer.

As seen from the evaluation results in FIGS. 2A and 3, it is preferable to make the planar shape of each protrusion 11 formed on the surface of the sapphire substrate to be square. Furthermore, one side of the square is preferably parallel to the x-axis (the a-axis of the sapphire substrate).

First Embodiment

Next, a semiconductor light-emitting device according to a first embodiment of the present invention will be described with reference to FIGS. 4A to 6D.

Figure 4A:
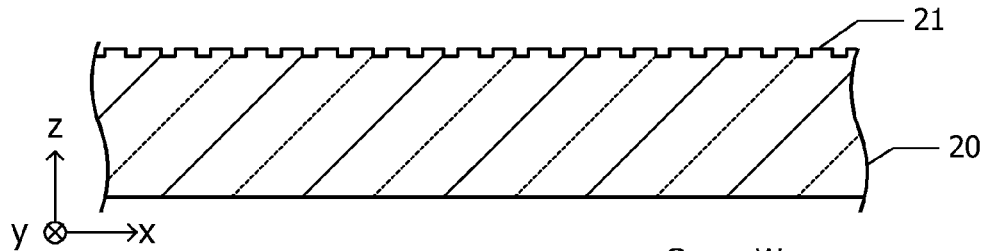
FIG. 4A is a cross sectional view of the substrate of a semiconductor light-emitting device according to a first embodiment of the present invention.

FIG. 4A shows a cross sectional view of a substrate 20 used in the semiconductor light-emitting device according to the first embodiment. A C-plane sapphire single crystal substrate is used as the substrate 20. The sapphire single crystal has a corundum structure. An xyz orthogonal coordinate system is defined in which the a-axis direction of the substrate 20 corresponds to the x-axis, its m-axis direction corresponds to the y-axis, and its c-axis direction corresponds to the z-axis.

To form an uneven pattern, a resist pattern is formed on the surface of the substrate 20 and then the surface layer of the substrate 20 is partially etched. The uneven pattern includes a plurality of protrusions 21. To etch the substrate 20, reactive ion etching (RIE) using an inductively coupled plasma (ICP) of $BCl_3$, $Cl_2$ and Ar may be performed, for example. After the substrate 20 has been etched, the resist pattern is removed. The depth in etching is 1 μm. Accordingly, the height of each protrusion 21 becomes 1 μm. A hard mask of $SiO_2$ or a metal may be used instead of the resist pattern.

Figure 4B:
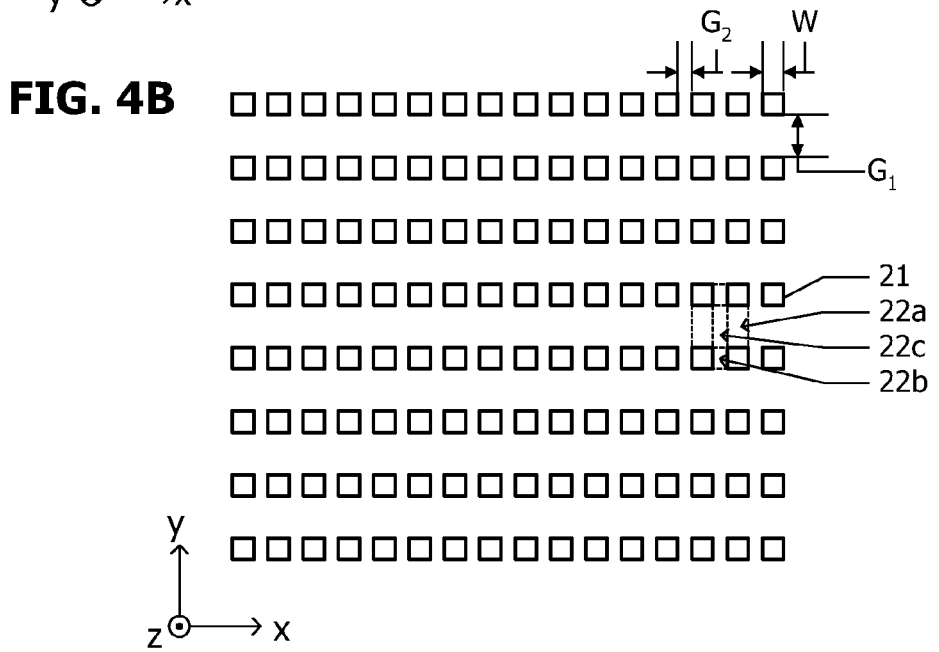
FIGS. 4B and 4C are respectively a plane view and perspective view of the substrate.

FIG. 4B shows a plane view of the substrate 20 after its surface has been etched. The protrusions 21 are periodically placed in the x direction and y direction. The planar shape of each protrusion 21 is, for example, a square, each side of which is W in length. The planar shape is preferably a square, for example, it may be a rectangle. In the first embodiment, the length W of each side is 3 μm. The interval $G_1$ between two adjacent protrusions 21 aligned in the y direction is 6 μm, and the interval $G_2$ between two adjacent protrusions 21 aligned in the x direction is 2 μm.

Figure 4C:
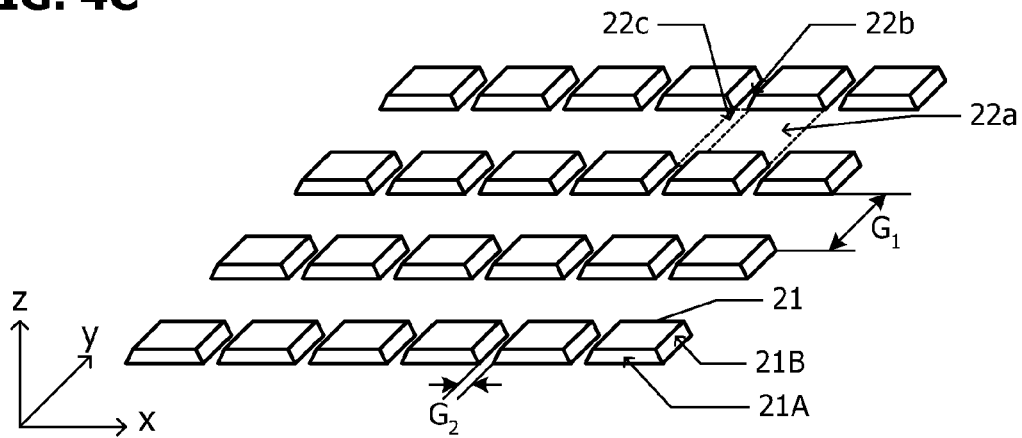

FIG. 4C is a perspective view of the uneven pattern formed on the substrate 20. Each protrusion 21 includes a square top surface and four side surfaces (step surfaces) linked to the four edges of the top surface. The four step surfaces are inclined relative to the x-y plane. The inclination angles (angles formed between the step surfaces and the x-y plane) depend on the etching condition of the substrate 20; the inclination angles may be 30 to 85 degrees, for example.

The four step surfaces of each protrusion 21 include a pair of first step surfaces 21A parallel to the x-axis and a pair of second step surfaces 21B parallel to the y-axis. A recess (relatively low area) 22a is defined between two adjacent protrusions 21 in the y-direction, the side surfaces of the recess 22a being the opposing first step surfaces 21A of the two protrusions 21. The width of the bottom surface of the recess 22a equals the interval $G_1$. Another recess (relatively low area) 22b is defined between two adjacent protrusions 21 in the x-direction, the side surfaces of the recess 22b being the opposing second step surfaces 21B of the two protrusions 21. The width of the bottom surface of the recess 22b equals the interval $G_2$. An area 22c defined by two recesses 22a and two recesses 22b is a relatively low area having the same height as the bottom surfaces of the recesses 22a and 22b.

Figure 5A:
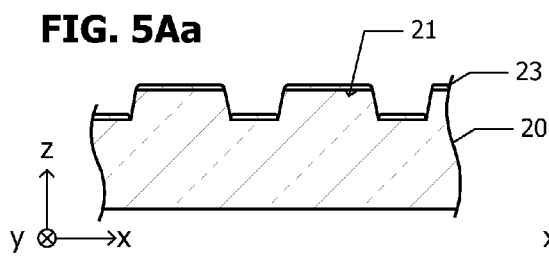
FIGS. 5Aa, 5Ab, 5Ba, 5Bb, 5Ca, and 5Cb are cross sectional views of the semiconductor light-emitting device according to the first embodiment in intermediate fabrication stages up to a process of forming an n-type semiconductor layer on the device.
Figure 5A:
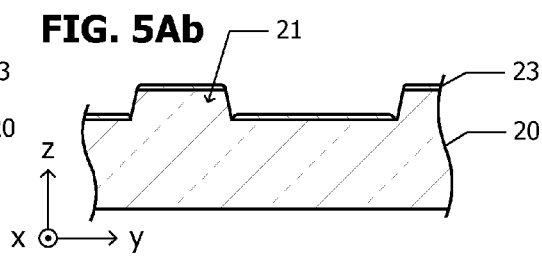

As FIGS. 5Aa and 5Ab indicate, buffer layers 23, made of GaN, with a thickness of 30 nm are formed on the substrate 20 by the MOCVD method. FIG. 5Aa shows the cross section perpendicular to the y-axis, and FIG. 5Ab shows the cross section perpendicular to the x-axis. Film forming conditions are as described below, for example.

Substrate temperature: 525° C.
Supply of tri-methyl-gallium (TMG): 10.4 μmol/minute
Supply of ammonia ($NH_3$): 3.3 slm The buffer layers 23 are formed on the top surfaces of the protrusions 21 and the bottom surfaces of the recesses among protrusions 21. The buffer layers 23 then undergoes annealing at 1000° C. for 30 seconds. The atmosphere of the annealing is a mixture of $N_2$ and $H_2$ gases. For example, the flow rate of the $N_2$ gas is 6 slm and the flow rate of the $H_2$ gas is 12 slm.

Figure 5B:
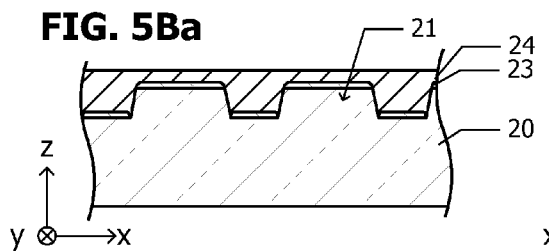
Figure 5B:
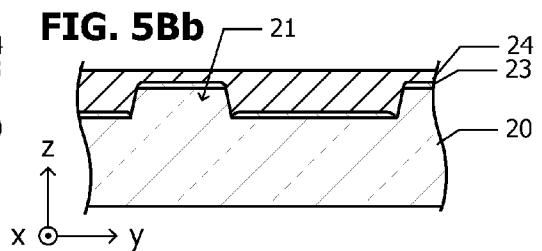

As FIGS. 5Ba and 5Bb indicate, base layers 24, made of GaN, are formed on the buffer layers 23 by the MOCVD method. FIG. 5Ba shows the cross section perpendicular to the y-axis, and FIG. 5Bb shows the cross section perpendicular to the x-axis. The base layers 24 are formed by repeating processes under the first film forming conditions and second film forming conditions alternately four times.

The first film forming conditions are as described below, for example.

Substrate temperature: 1000° C.
Supply of TMG: 23 μmol/minute
Supply of $NH_3$: 2.2 slm
Film thickness: 20 nm The second film forming conditions are as described below, for example.

Substrate temperature: 1000° C.
Supply of TMG: 45 μmol/minute
Supply of $NH_3$: 4.4 slm
Film thickness: 80 nm Under the first film forming conditions, growth in the vertical direction took precedence over growth in the horizontal direction. The growth in the horizontal direction under the second film forming conditions is faster than that under the first film forming conditions. When growth under the first film forming conditions and growth under the second film forming conditions were alternately repeated four times, the base layers 24 formed on the protrusions 21 and the base layers 24 formed on the recesses began to be combined. At that time, the base layers 24 deposited on the protrusions 21 was about 400 nm thick. The surfaces of the base layers 24 do not need to be geometrically completely flat. It is sufficient that, for example, the surfaces of the base layers 24 are flatter than the surface of the substrate 20. If the difference in height of the surface of the base layers 24 is at most half the difference between the highest and lowest portions on the surface of the substrate 20, the base layers 24 are preferable as the base of the semiconductor light-emitting device.

Figure 5C:
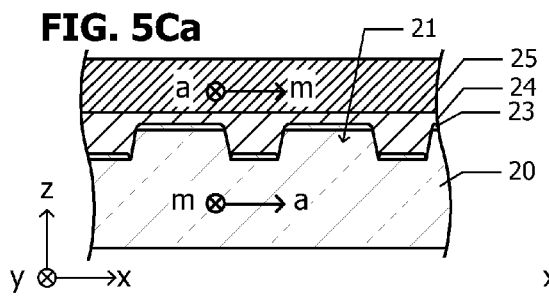
Figure 5C:
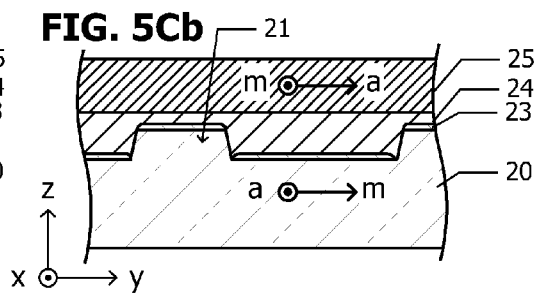

As shown in FIGS. 5Ca and 5Cb, an n-type semiconductor layer 25 made of n-type GaN with a thickness of 3 μm is formed on the base layer 24 by the MOCVD method. FIG. 5Ca shows the cross section perpendicular to the y-axis, and FIG. 5Cb shows the cross section perpendicular to the x-axis. Silicon (Si) is used as an n-type dopant, the concentration of which is $5 \times 10^{18}$ $cm^{-3}$. Film forming conditions are as described below.

Substrate temperature: 1000° C.
Supply of TMG: 45 μmol/minute
Supply of $NH_3$: 5.5 slm
Film forming time: 1 hour The buffer layer 23, base layer 24, and n-type semiconductor layer 25 have a wurtzite structure, the a-axis of which faces a direction rotated by 30 degrees relative to the a-axis of the substrate 20. Accordingly, the a-axes of the buffer layer 23, base layer 24, and n-type semiconductor layer 25 are parallel to the y-axis, their m-axes are parallel to the x-axis.

Figure 6A:
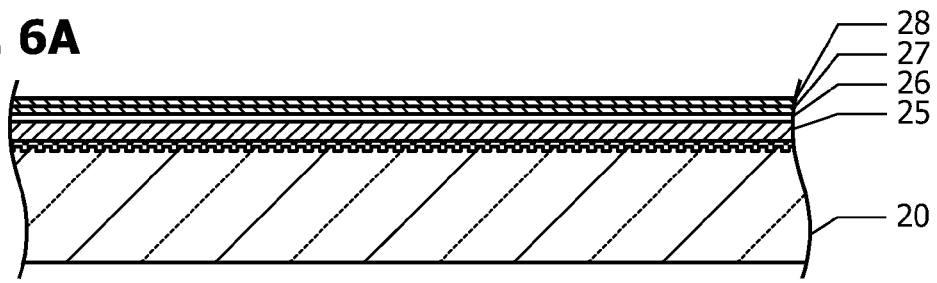
FIGS. 6A to 6C are cross sectional views of the semiconductor light-emitting device according to the first embodiment in intermediate stages up to a process of fabricating the device.

As shown in FIG. 6A, a light emitting layer 26 is formed on the n-type semiconductor layer 25. The light emitting layer 26 includes, for example, GaN layers, each being 14 nm thick, and $In_{0.3}Ga_{0.7}N$ layers, each being 2 nm thick, which are alternately laminated by, for example, five times. Film forming conditions for the light emitting layer 26 are as described below.

Substrate temperature: 730° C.
Supply of TMG: 3.6 μmol/minute
Supply of tri-methyl indium (TMI): 10 μmol/minute
Supply of $NH_3$: 4.4 slm While the GaN layer is being formed, supply of TMI is stopped.

A p-type semiconductor layer 27, made of p-type AlGaN, with a thickness of 40 nm is formed on the light emitting layer 26. Magnesium (Mg) is used as a p-type dopant, the concentration of which is $1 \times 10^{20}$ cm$^{-3}$. Film forming conditions are as described below.

Substrate temperature: 870° C.
Supply of TMG: 8.1 μmol/minute
Supply of tri-methyl aluminum (TMA): 7.56 μmol/minute
Supply of $NH_3$: 4.4 slm A p-type semiconductor layer 28, made of p-type GaN, is formed on the p-type semiconductor layer 27. The p-type semiconductor layer 28 includes a lower layer with a thickness of 100 nm, the Mg concentration of which is $2 \times 10^{19}$ cm$^{-3}$ and an upper layer with a thickness of 20 nm, the Mg concentration of which is $2 \times 10^{20}$ cm$^{-3}$. Film forming conditions are as described below.

Substrate temperature: 870° C.
Supply of TMG: 18 μmol/minute
Supply of $NH_3$: 4.4 slm The p-type semiconductor layer 28 then undergoes thermal processing at 900° C. for one minute.

Figure 6B:
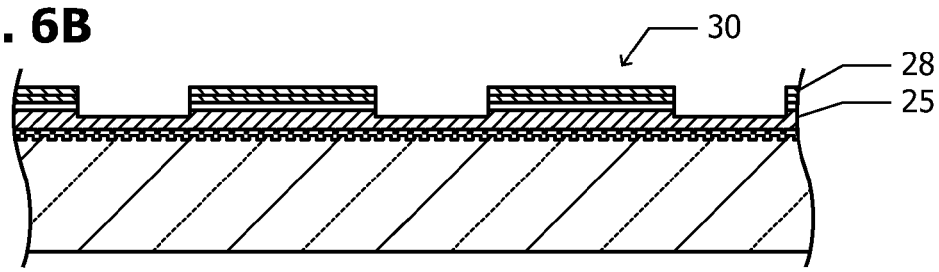

As shown in FIG. 6B, etching is performed from the surface of the p-type semiconductor layer 28 to an intermediate point in the thickness direction of the n-type semiconductor layer 25 to leave a plurality of mesas 30. Each mesa 30, for example, has a planar shape obtained by cutting a fan-shaped plane from the vicinity of one vertex of a square, each side of which is 350 μm, the fan-shaped plane being centered at that vertex. The n-type semiconductor layer 25 is partially exposed on the area from which the fan-shaped plane has been cut off. The height of each mesa 30 is 700 nm, for example.

Figure 6C:
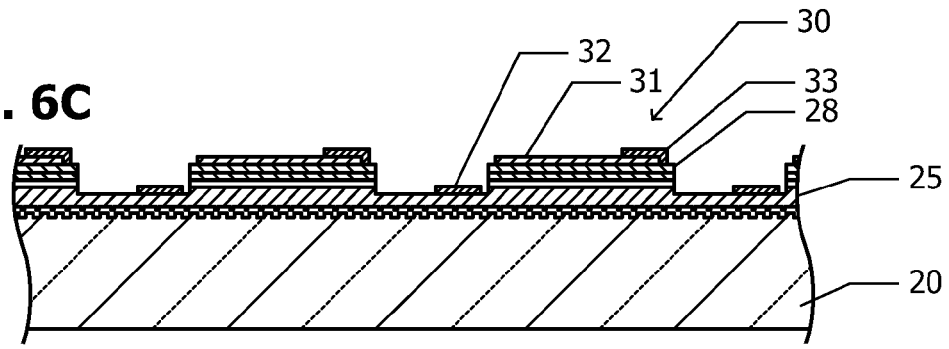

As shown in FIG. 6C, a transparent electrode 31 made of an indium tin oxide (ITO) is formed on the top of each mesa 30. The transparent electrode 31 is 200 nm thick, for example. Then, n-side electrodes 32 are formed on the n-type semiconductor layer 25 exposed on the area having a fan-shaped plane which has been cut off from the square. Each n-side electrode 32 has a two-layer structure including, for example, a Ti film with a thickness of 1 nm and an Al film, with a thickness of 1000 nm, formed thereon.

A p-side pad 33 is formed on a partial area of each transparent electrode 31. The p-side pad 33 is structured by laminating a Ti film with 0.5 nm thick, an Rh film with 100 nm thick, a Ti film with 50 nm thick, and an Au film with 1000 nm thick in the recited order. Part of the p-side pad 33 may be placed in direct contact with the p-type semiconductor layer 28.

Figure 6D:
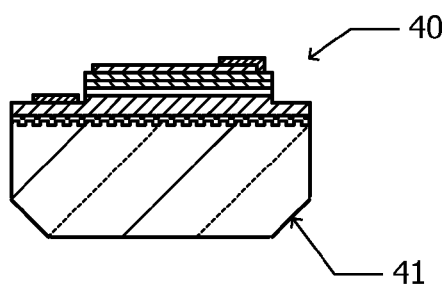
FIG. 6D is a cross sectional view of the semiconductor light-emitting device.

As shown in FIG. 6D, after grooves have been formed on the back of the substrate 20, the substrate 20 is divided into chips 40 by dicing. An oblique plane 41 corresponding to a groove used for dicing is formed in a place where the back and end surface of the chip 40 are linked.

Figure 7A:
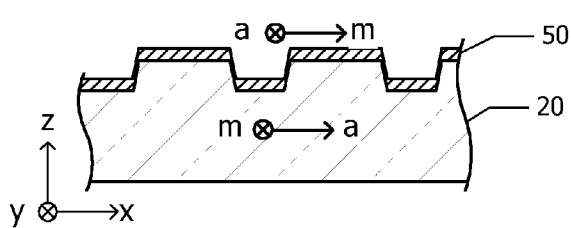
FIGS. 7Aa, 7Ab, 7Ba, and 7Bb are cross sectional views of GaN layers formed by comparative methods and substrates on which the GaN layers are formed.
Figure 7A:
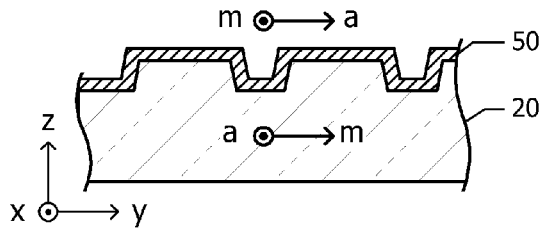

A method of forming a GaN layer in a comparative example will be described with reference to FIGS. 7Aa to 7Bb. In the comparative example, protrusions corresponding to the protrusions 21 shown in FIG. 4B in the first embodiment are spaced at equal intervals in the x direction and y direction. GaN growth in the a-axis direction is faster than that in the m-axis direction. Accordingly, a GaN film 50 shown in FIG. 7Ab that is formed on the step surface parallel to the x-axis is thicker than another GaN film 50 shown in FIG. 7Aa that is formed on the step surface parallel to the y-axis.

Figure 7B:
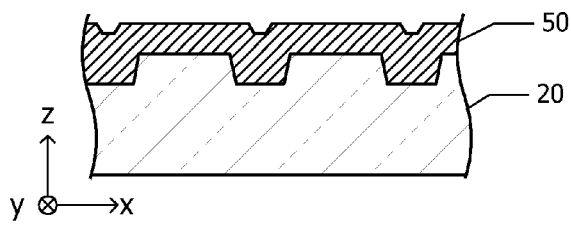
Figure 7B:
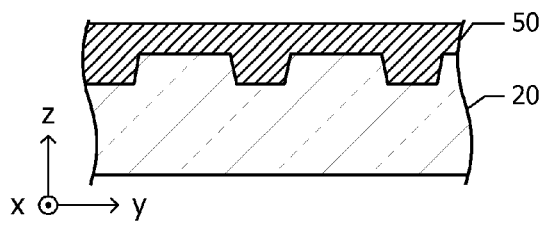

When, as shown in FIG. 7Bb, the gap between two adjacent protrusions in the y-direction is filled and the top surface of the GaN film on the filled gap becomes substantially flat, a recess is left on the top surface of the GaN film between two adjacent protrusions in the x-axis, as shown in FIG. 7Ba. When the formation of the GaN film 50 continues until the recess is filled and the GaN film 50 becomes flat, the film formation continues on the cross section shown in FIG. 7Bb even after the top surface of the GaN film 50 has become flat.

In the first embodiment, the interval $G_2$ between two adjacent protrusions 21 in the x direction is smaller than the interval $G_1$ between two adjacent protrusions 21 in the y direction, as shown in FIG. 4B. Accordingly, a growth time taken until the top surface of the GaN layer becomes flat in the recess 22b between two adjacent protrusions 21 in the x direction approaches a growth time taken until the top surface of the GaN layer becomes flat in the recess 22a between two adjacent protrusions 21 in the y direction. A growth time taken until the top surface of the GaN layer becomes flat can thereby be shortened.

In the relatively low area 22c, a GaN layer is formed by growth in the thickness direction and growth in the horizontal direction from the GaN layer formed in the recesses 22a and 22b adjacent to the area 22c.

When film formation under the first film forming conditions and film formation under the second film forming conditions described above were repeated 12 times with the intervals between of two adjacent protrusions 21 in the x direction and y direction set to 6 μm each, the top surfaces of the GaN layers began to be combined. In the first embodiment, a flat base layer 24 was obtained by repeating four times. Compared to the comparative example, therefore, the method in the first embodiment can shorten the film formation time to about one-third.

Next, variations of the first embodiment will be described. In these variations, the intervals $G_1$ and $G_2$ shown in FIG. 4B were respectively set to 18 μm and 6 μm. When film formation under the first film forming conditions and film formation under the second film forming conditions described above were repeated 12 times, a base layer 24 having a substantially flat top surface was obtained. That is, in comparison with the comparative example above, the film formation time taken until a flat upper surface was obtained was almost the same, in spite of the expansion of the interval $G_1$ from 6 μm to 18 μm.

The following conditions may be used as the first film forming conditions under which growth in the thickness direction takes precedence.

Supply of TMG: 10 to 30 μmol/minute
Supply of $NH_3$: 1 to 3 slm
Film thickness: 10 to 60 nm The following conditions may also be used as the second film forming conditions under which growth in the horizontal direction is faster than under the first film forming conditions.

Supply of TMG: 30 to 70 μmol/minute
Supply of $NH_3$: 3 to 7 slm
Film thickness: 30 to 140 nm The film formed under the second film forming conditions is preferably thicker than the film formed under the first film forming conditions.

If the interval $G_2$ shown in FIG. 4B is too small in comparison with the interval $G_1$, the recess 22b corresponding to the short interval $G_2$ is filled before the recess 22a corresponding to the long interval $G_1$ is filled. If a difference between the growth time required to fill the recess 22b corresponding to the short interval $G_2$ and the growth time required to fill the recess 22a corresponding to the long interval $G_1$ is small, it becomes possible to efficiently fill these recesses. To increase the filling efficiency, the long interval $G_1$ is preferably 4.5 times or less the short interval $G_2$. Furthermore, the long interval $G_1$ is preferably 1.5 times or more the short interval $G_2$.

In the first embodiment, one axis of the protrusion 21 was parallel to the x-axis (the a-axis of the substrate 20). However, the one side does not need to be completely parallel to the x-axis. If, for example, an angle formed between the x-axis and a direction in which the one side extends is equal to or smaller than 15 degrees, the substantially the same effect as in the first embodiment can be obtained. Furthermore, if an angle formed between the y-axis and a direction in which another one side extends is equal to or smaller than 15 degrees, the substantially the same effect as in the first embodiment can also be obtained.

Figure 8A:
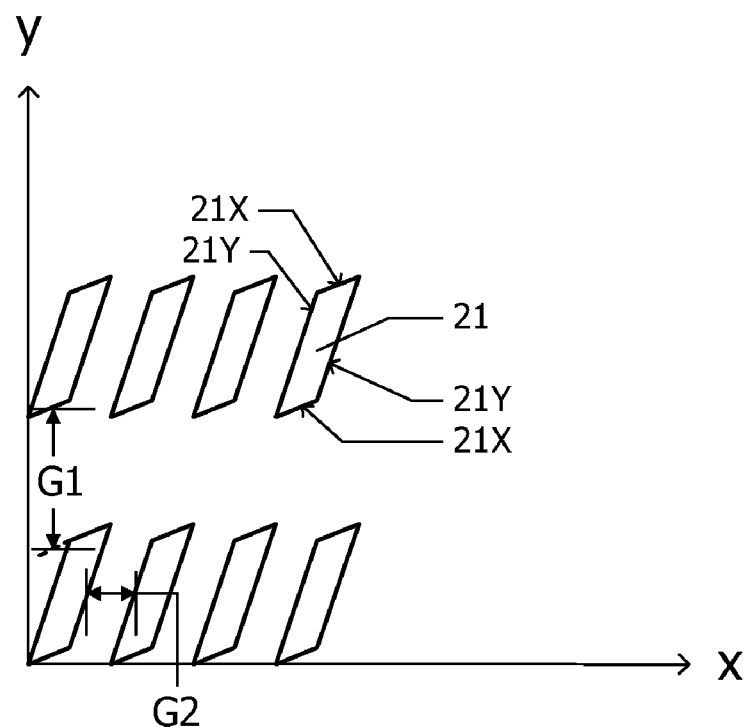
FIGS. 8A and 8B are respectively plane views of the substrates of semiconductor light-emitting devices according to first and second variations of the first embodiment.

FIG. 8A is a plane view of the substrate 20 used in the method of fabricating the semiconductor light-emitting device in a first variation of the first embodiment. The protrusions 21 are regularly arranged in the x-axis and y-axis directions. The planar shape of each protrusion 21 is a parallelogram; it is neither a rectangle nor a square. The angle formed between the x-axis and a pair of opposing sides 21X is 15 degrees or less, and the angle formed between the y-axis and another pair of opposing sides 21Y is also 15 degrees or less.

The two opposing sides 21X of two adjacent protrusions 21 in the y-axis direction are mutually parallel, and the two opposing sides 21Y of two adjacent protrusions 21 in the x-axis direction is also mutually parallel. The interval $G_1$ between two adjacent protrusions 21 in the y direction is defined as the interval in the y direction between the two opposing sides 21X of two adjacent protrusions 21 in the y-axis direction. Similarly, the interval $G_2$ between two adjacent protrusions 21 in the x direction is defined as the interval in the x direction between the two opposing sides 21Y of two adjacent protrusions 21 in the x-axis direction. The interval $G_1$ is preferably 1.5 times or more and 4.5 times or less the interval $G_2$.

Figure 8B:
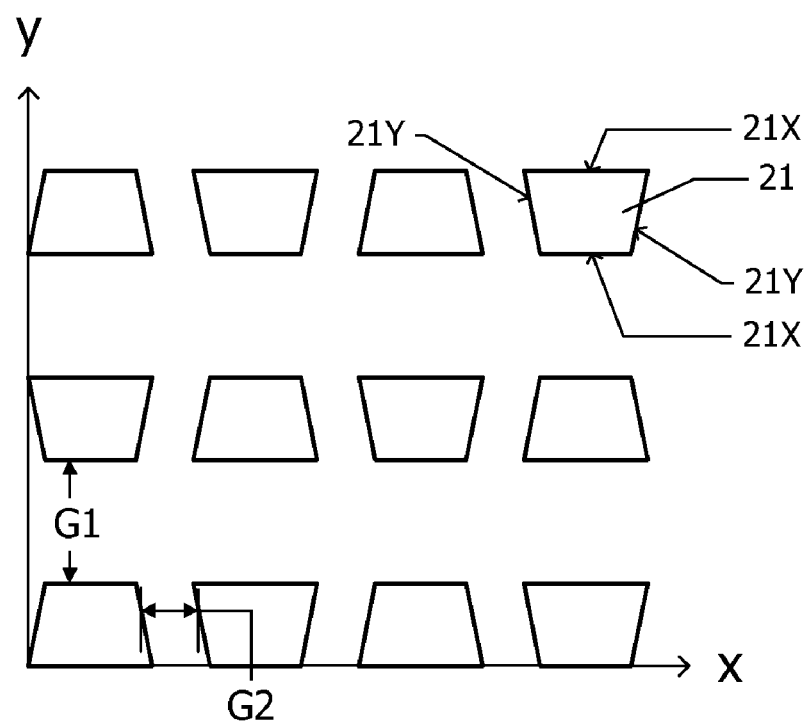

FIG. 8B is a plane view of the substrate 20 used in the method of fabricating the semiconductor light-emitting device in a second variation of the first embodiment. In the second variation, the planar shape of each protrusion 21 is a trapezoid. The sides 21X corresponding to the upper base and lower base of the trapezoid are parallel to the x-axis. The sides 21Y corresponding to the legs of the trapezoid are inclined at 15 degrees with respect to the y-axis.

Two adjacent protrusions 21 in the x-axis direction are positioned so that when one of them is rotated by 180 degrees, it coincides with the other protrusion 21. Therefore, the two opposing sides 21Y of the two adjacent protrusions 21 in the x-axis direction are parallel to each other. Since the sides 21X of each protrusion 21 are parallel to the x-axis, the two opposing sides 21X of the two adjacent protrusions 21 in the y-axis direction are also parallel to each other. The interval $G_1$ between two adjacent protrusions 21 in the y direction and the interval $G_2$ between two adjacent protrusions 21 in the x direction are defined as in the first variation shown in FIG. 8A.

In the second variation as well, the interval $G_1$ is preferably 1.5 times or more and 4.5 times or less the interval $G_2$.

Figure 9A:
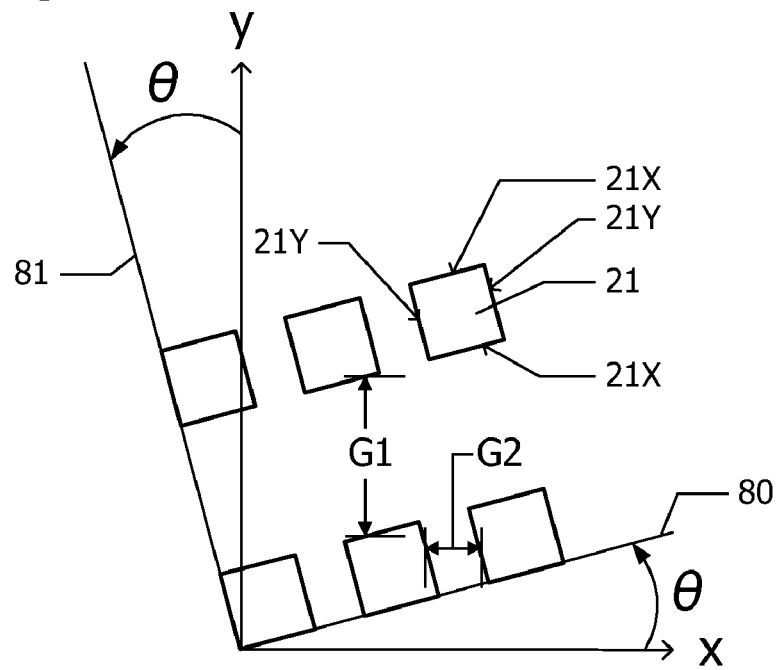
FIGS. 9A and 9B are respectively plane views of semiconductor light-emitting devices according to third and fourth variations of the first embodiment.

FIG. 9A is a plane view of the substrate 20 used in the method of fabricating the semiconductor light-emitting device in a third variation of the first embodiment. The protrusions 21 are regularly (periodically) arranged in a first direction 80 and in a second direction 81. The first direction 80 is tilted with respect to the x-axis. The angle θ defined between the first direction 80 and x-axis is equal to or less than 15 degrees. The second direction 81 is orthogonal to the first direction 80.

A pair of opposing sides 21X of each protrusion 21 is parallel to the first direction 80, and the other pair of opposing sides 21Y is parallel to the second direction 81. Therefore, the planar shape of each protrusion 21 is a square or rectangle.

An interval in the y direction between two adjacent protrusions 21 in the second direction 81 is used as the interval $G_1$ between two adjacent protrusions 21 in the y-direction. Similarly, an interval in the x-direction between two adjacent protrusions 21 in the first direction 80 is used as the interval $G_2$ between two adjacent protrusions 21 in the x direction. Neither an interval between two adjacent protrusions 21 in the first direction 80 nor an interval between two adjacent protrusions 21 in the second direction 81 are used because crystals grow in the x-axis and y-axis, not in the first direction 80 and second direction 81. In the third variation as well, the interval $G_1$ is preferably 1.5 times or more and 4.5 times or less the interval $G_2$.

Figure 9B:
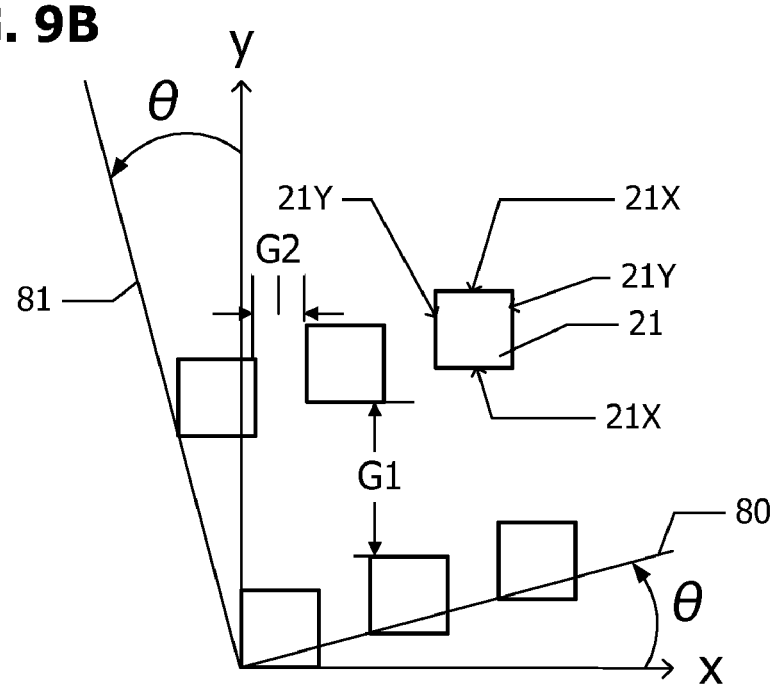

FIG. 9B is a plane view of the substrate 20 used in the method of fabricating the semiconductor light-emitting device in a forth variation of the first embodiment. The protrusions 21 are regularly (periodically) arranged in the first direction 80 and in the second direction 81. The first direction 80 and second direction 81 are the same as in the third variation shown in FIG. 9A.

A pair of opposing sides 21X of each protrusion 21 is parallel to the x-axis, and the other pair of opposing sides 21Y is parallel to the y-axis. Therefore, the planar shape of each protrusion 21 is a square or rectangle. As in the third variation shown in FIG. 9A, an interval in the y direction between two adjacent protrusions 21 in the second direction 81 is used as the interval $G_1$ between two adjacent protrusions 21 in the y direction, and an interval in the x direction between two adjacent protrusions 21 in the first direction 80 is used as the interval $G_2$ between two adjacent protrusions 21 in the x direction. In the forth variation as well, the interval $G_1$ is preferably 1.5 times or more and 4.5 times or less the interval $G_2$.

In the first embodiment and its first to fourth variations described above, the interval $G_1$ is more preferably 3 times or less the interval $G_2$. The first to fourth variations of the first embodiment have indicated structures in which the sides of each protrusion 21 are tilted with respect to the x-axis and y-axis and/or the protrusions 21 are arranged in directions tilted with respect to the x-axis and y-axis. Although almost the same effect as in the first embodiment shown in FIG. 4B can be obtained even from these structures, it is most preferable to arrange each protrusion 21 so that its sides are parallel to the x-axis and y-axis and to arrange the protrusions 21 in parallel to the x-axis and y-axis.

Although a C-plane sapphire single crystal substrate has been used as the substrate 20 in the first embodiment, a C-plane substrate including crystals having another corundum structure may be used instead. A III-V compound semiconductor including Ga and N may be used as the base film formed on the substrate.

Second Embodiment

Figure 10A:
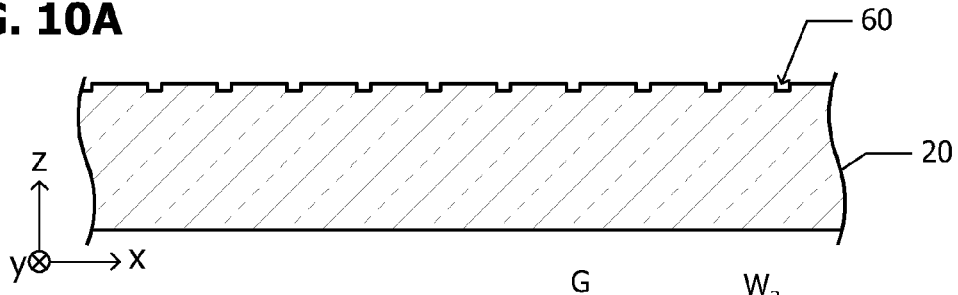
FIG. 10A is a cross sectional view of the substrate of a semiconductor light-emitting device according to a second embodiment.

FIG. 10A is a cross sectional view of the substrate 20 used in the method of fabricating a semiconductor light-emitting device according to a second embodiment. In the description that follows, only differences from the first embodiment will be noted and descriptions for the same structures as in the first embodiment will be omitted. The uneven pattern formed on the surface of the substrate 20 includes a plurality of recesses 60.

Figure 10B:
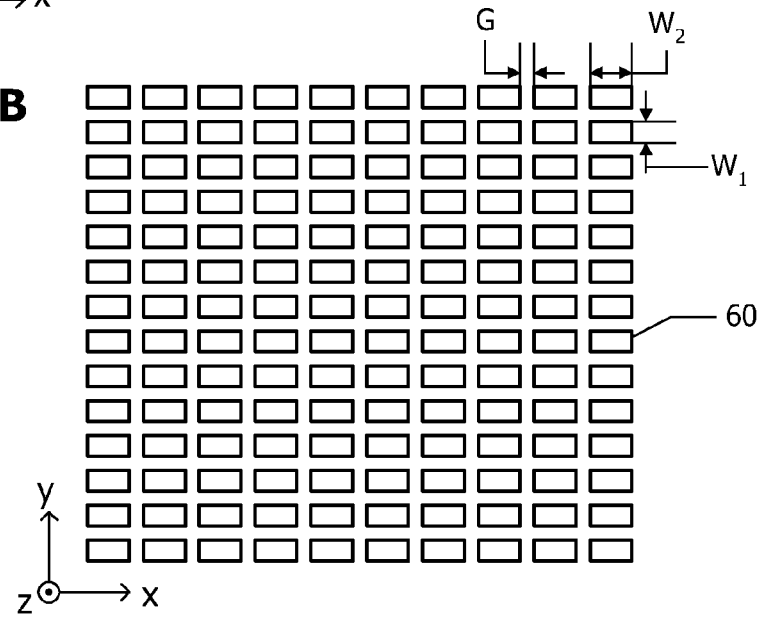
FIGS. 10B and 10C are respectively a plane view and a perspective view of the substrate.

FIG. 10B is a plane view of the substrate 20. The plurality of recesses 60 is periodically arranged in the x direction and y direction. The planar shape of each recess 60 is a rectangle two sides of which are parallel to the x-axis. The length $W_1$ of the sides parallel to the y axis is shorter than the length $W_2$ of the sides parallel to the x axis. Both the interval between two adjacent recesses 60 in the x direction and the interval between two adjacent recesses 60 in the y direction are G.

Figure 10C:
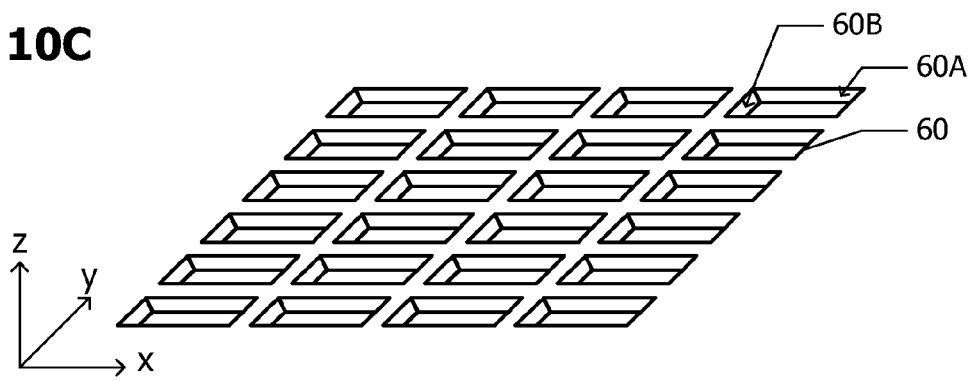

FIG. 10C is a perspective view of an uneven pattern formed on the substrate 20. Each recess 60 includes a pair of first step surfaces 60A, which oppose each other in the x direction, a pair of second step surfaces 60B, which oppose each other in the y direction, and a bottom surface. The step surfaces 60A and 60B are tilted with respect to the x-y plane. The tilt angles (angles defined between the step surfaces and the x-y plane) depend on the etching condition of the substrate 20; the tilt angles may be 30 to 85 degrees, for example.

Figure 11A:
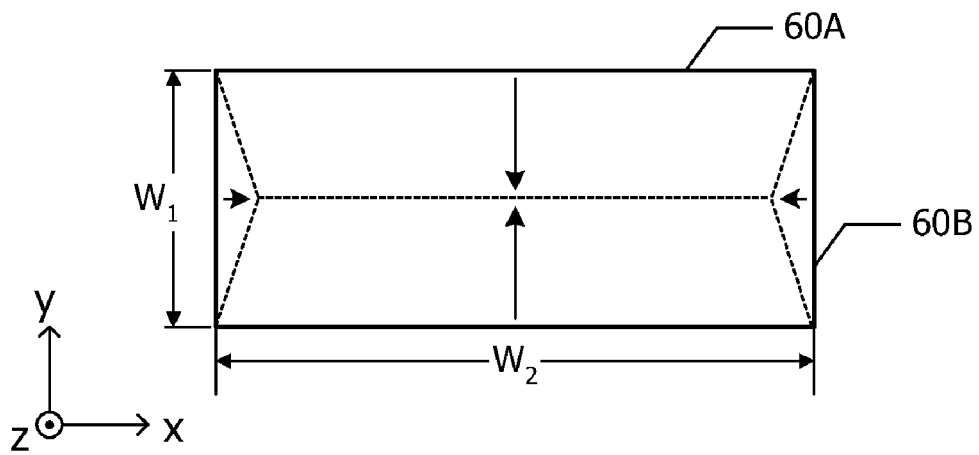
FIGS. 11A and 11B are plane views respectively illustrating how base layers of the semiconductor light-emitting devices according to the second embodiment and its variation grow.

FIG. 11A illustrates crystalline growth when a GaN layer is grown on the substrate 20. GaN growth occurs in a lateral direction of the a-axis direction from the step surfaces 60A toward the interior of the recess 60, and GaN growth also occurs in a lateral direction of the m-axis direction from the step surfaces 60B toward the interior of the recess 60. GaN growth in the a-axis direction is faster than in the m-axis direction. Accordingly, when growth in the a-axis direction occurs to half the length $W_1$ of the shorter side of the recess 60, the interior portion of the recess 60 is filled with the GaN layer.

Figure 11B:
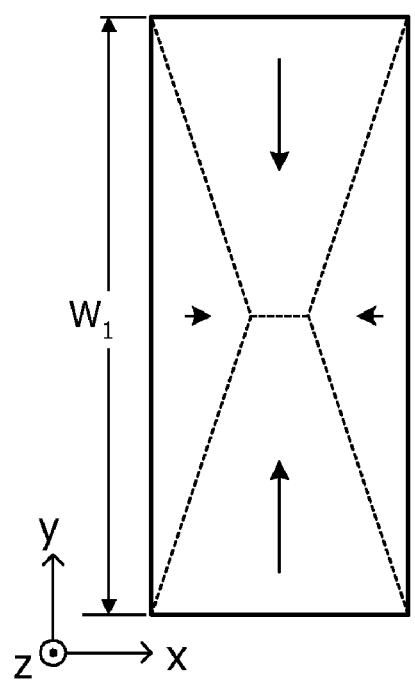

FIG. 11B illustrates an example in which the recess 60 is longer in the y direction. In this case as well, when growth in the a-axis direction occurs to half the length $W_1$ of the longer side of the recess 60, the interior portion of the recess 60 is filled with the GaN layer.

Accordingly, when the length in the y direction of the planar shape of the recess 60 is shorter than that in the x direction, a growth time taken until the interior portion of the recess 60 is filled with the GaN layer can be shortened. The length $W_2$ of the longer side is preferably within the range of 1.5 to 4.5 times the length $W_1$ of the shorter side. In this range, a significant reduction in the growth time can be expected.

In the second embodiment, one side of the recess 60 was parallel to the x-axis (the a-axis of the substrate 20). However, the one side does not need to be completely parallel to the x-axis. If, for example, an angle defined between the x-axis and a direction in which the one side extends is within 15 degrees, the substantially the same effect as in the second embodiment can be obtained. If an angle defined between the y-axis and a direction in which another one side extends is within 15 degrees, the another side is not necessarily parallel to the y-axis.

When the sides of the recess 60 are not parallel to the x-axis or y-axis, the planar shape of the recess 60 is not always a rectangle. Even when the planar shape is not a rectangle, opposing sides are preferably parallel. Specifically, the planar shape of the recess 60 is preferably a parallelogram. In this case, an interval in the y-axis direction between a pair of opposing sides tilted at 15 degrees or less with respect to the x-axis is used as the interval $W_1$, shown in FIG. 11B, in the y-axis direction. Similarly, an interval in the x-axis direction between a pair of opposite sides tilted at 15 degrees or less with respect to the y-axis is used as the interval $W_2$ in the x-axis direction.

The interval $W_2$ in the x-axis direction is preferably equal to or more than 1.5 times the interval $W_1$ in the y-axis direction, and equal to or less than 4.5 times the interval $W_1$ in the y-axis direction. As shown in FIG. 11B, the sides of the recess 60 are most preferably parallel to the x-axis and y-axis. The interval $W_2$ is more preferably equal to or less than 3 times the interval $W_1$.

A semiconductor light-emitting device is obtained by forming a light emitting structure as in the first embodiment on the GaN layer formed on the substrate 20. When the recesses 60 scatter or diffract light, high external quantum efficiency is obtained.

Third Embodiment

Figure 12A:
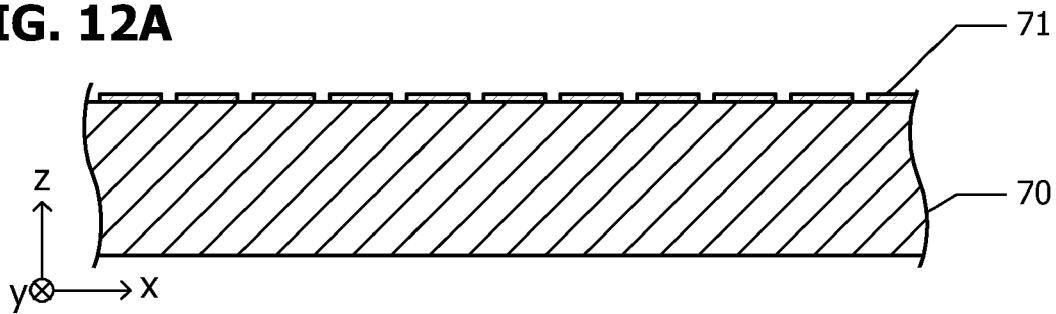
FIG. 12A is a cross sectional view of the substrate of a semiconductor light-emitting device according to a third embodiment of the present invention.

FIG. 12A is a cross sectional view of a substrate 70 used in the method of fabricating a semiconductor light-emitting device according to a third embodiment. A C-plane GaN single crystal substrate is used as the substrate 70.

A plurality of mask patterns 71 made of $SiO_2$ or another insulating material is formed on the surface of the substrate 70. An xyz orthogonal coordinate system is defined in which the m-axis direction of the substrate 70 corresponds to the x-axis, its a-axis direction corresponds to the y-axis, and its c-axis direction corresponds to the z-axis.

Figure 12B:
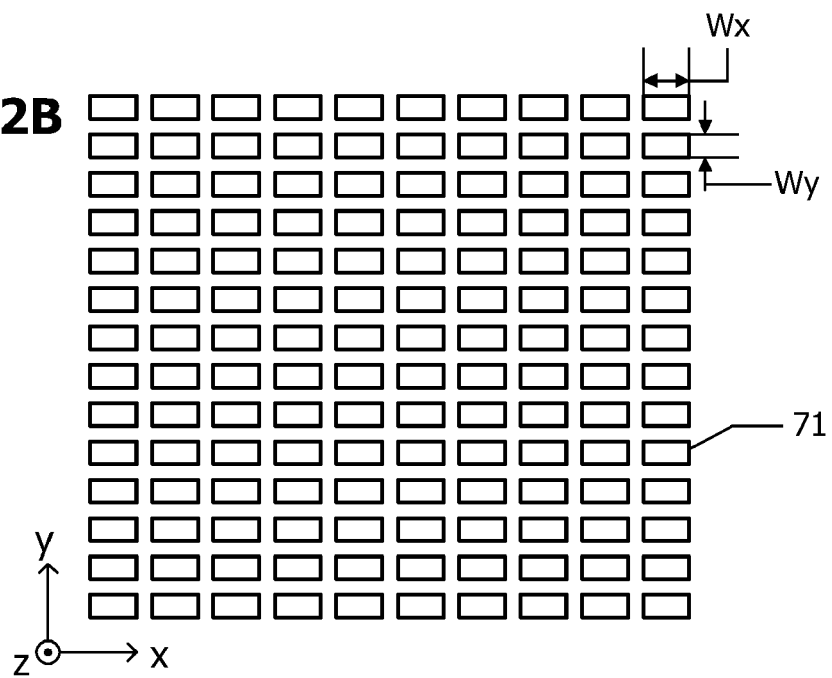
FIG. 12B is a plane view of the substrate.

FIG. 12B is a plane view of the mask pattern 71. The planar shape of each mask pattern 71 is a rectangle, two sides of which are parallel to the x-axis. The length of the sides parallel to the x-axis is represented by Wx, and the length of the sides parallel to the y-axis is represented by Wy.

Figure 13A:
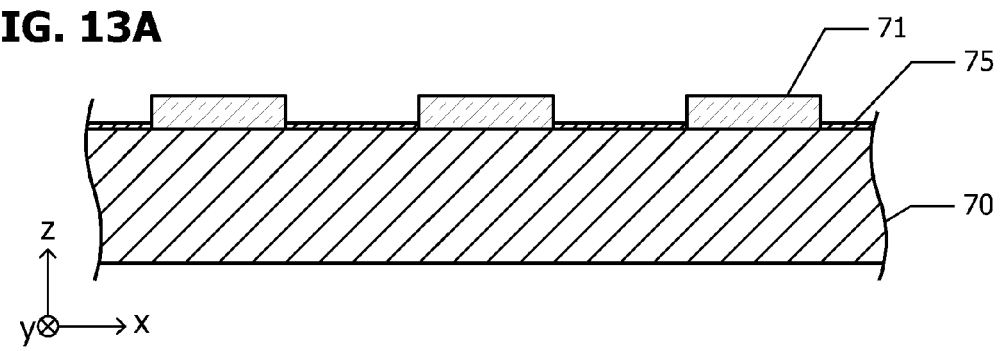
FIGS. 13A to 13C are cross sectional views of the semiconductor light-emitting device according to the third embodiment in intermediate stages up to a process of forming a base layer.
Figure 13B:
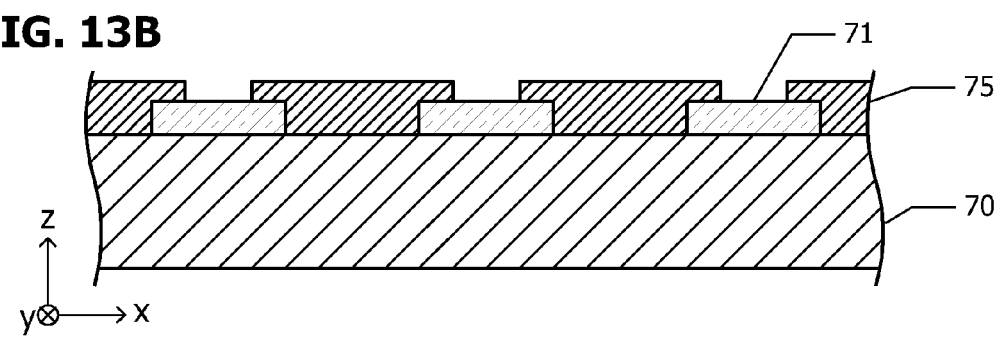
Figure 13C:
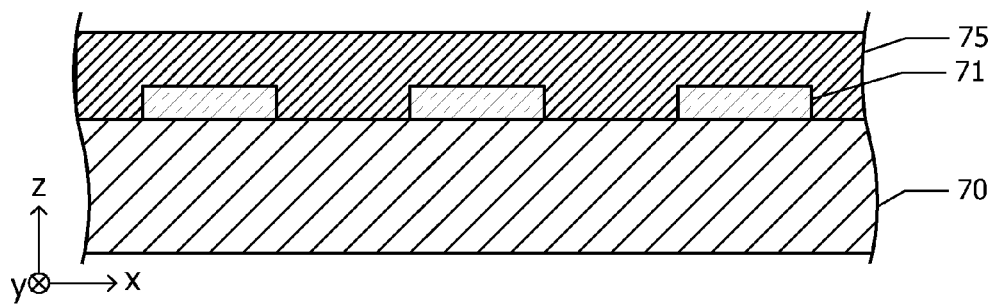

FIGS. 13A to 13C show cross sections in time series when GaN layers are grown on the substrate 70.

As shown in FIG. 13A, a GaN layer 75 is formed on areas where the substrate 70 is exposed. No GaN layer grows on the mask patterns 71. When the grown GaN layer 75 reaches the tops of the mask patterns 71, lateral growth begins from the edges of the mask patterns 71 toward the inner sides, as shown in FIG. 13B. When the lateral growth proceeds, the mask patterns 71 are completely covered with the GaN layer 75 as shown in FIG. 13C.

The GaN layer 75 can be used as the base layer to form, on the base layer, the same light emitting structure as in the first embodiment. When the mask patterns 71 scatter or diffract light, high external quantum efficiency is obtained.

Lateral growth in the y direction (a-axis direction), which occurs on the top of the mask patterns 71, is faster than lateral growth in the x direction (m-axis direction). Therefore, when the dimension of the mask pattern 71 in the y direction is smaller than that in the x direction, the tops of the mask patterns 71 can be covered with the GaN layer 75 in a shorter time.

When the dimension $W_x$ of the mask pattern 71 in the x direction is within the range of 1.5 to 4.5 times its dimension $W_y$ in the y direction, a significant reduction in the film forming time of the GaN layer can be expected.

In the third embodiment, one side of the mask pattern 71 was parallel to the x-axis (the m-axis of the substrate 70). However, the one side does not need to be completely parallel to the x-axis. If, for example, an angle defined between the x-axis and a direction in which the one side extends is equal to or less than 15 degrees, the substantially the same effect as in the third embodiment can be obtained. If an angle defined between the y-axis and a direction in which another one side extends is equal to or less than 15 degrees, the another one side is not necessarily parallel to the y-axis. In this case, the planar shape of the mask pattern 71 is preferably a parallelogram. An interval in the x-axis direction between a pair of opposite sides tilted at 15 degrees or less with respect to the y-axis is used as the dimension $W_x$ in the x-axis direction shown in FIG. 12B. Similarly, an interval in the y-axis direction between a pair of opposite sides tilted at 15 degrees or less with respect to the x-axis is used as the dimension $W_y$ in the y-axis direction.

The dimension $W_x$ in the x-axis direction is preferably equal to or more than 1.5 times the dimension $W_y$ in the y-axis direction and equal to or less than 4.5 times the dimension $W_y$ in the y-axis direction. As shown in FIG. 12B, the sides of the mask pattern 71 are most preferably parallel to the x-axis and y-axis. The dimension $W_x$ is more preferably equal to or less than 3 times the dimension $W_y$.

The present invention has been described according to the embodiments, but the present invention is not limited to these embodiments. As would be apparent to one skilled in the relevant art, various modifications, improvements, and combinations, for example, are possible.

What is claimed is:

1. A semiconductor light-emitting device, comprising:
   a substrate having a corundum crystal structure that has a c-axis facing in a thickness direction, a plurality of protrusions being formed on a surface of the substrate;
   a base film formed on the surface of the substrate, on which the plurality of protrusions are formed, the base film being made of a III-V compound semiconductor including Ga and N, a surface of the base film being flatter than the surface of the substrate; and
   a light emitting structure, formed on the base film, that includes an n-type semiconductor layer and a p-type semiconductor layer, which are made of III-V compound semiconductors including Ga and N;
   wherein when a direction that is tilted by less than 15 degrees with respect to an a-axis of the base film is designated as a first direction and another direction orthogonal to the first direction is designated as a second direction,
   the protrusions are regularly arranged, in the first direction and the second direction, a planar shape of each protrusion having edges matching the four sides of a quadrangle, the quadrangle having a pair of first sides tiled by less than 15 degrees with respect to an m-axis of the base film and a pair of second sides tilted by less than 15 degrees with respect to the a-axis of the base film,
   the first sides, which face each other, of quadrangles matching two adjacent protrusions in the first direction are mutually parallel, and the second sides, which face each other, of the quadrangles corresponding to two adjacent protrusions in the second direction are mutually parallel, an interval between the two second sides, which face each other, in the m-axis direction being wider than an interval between the two first sides, which face each other, in the a-axis direction.

2. The semiconductor light-emitting device according to claim 1, wherein an interval in the a-axis direction between the two adjacent protrusions in the first direction is equal to or less than 4.5 times an interval in the m-axis direction between the two adjacent protrusions in the second direction.

3. A semiconductor light-emitting device, comprising:
   a substrate having a corundum crystal structure that has a c-axis facing in a thickness direction, a plurality of protrusions being formed on a surface of the substrate;
   a base film formed on the surface of the substrate, on which the plurality of protrusions are formed, the base film being made of a III-V compound semiconductor including Ga and N, a surface of the base film being flatter than the surface of the substrate; and
   a light emitting structure, formed on the base film, that includes an n-type semiconductor layer and a p-type semiconductor layer, which are made of III-V compound semiconductors including Ga and N;
   wherein a planar shape of each of the protrusions has edges matching the four sides of a parallelogram that has a pair of first sides tilted by less than 15 degrees with respect to an m-axis of the base film and a pair of second sides tilted by less than 15 degrees with respect to an a-axis of the base film, and
   wherein an interval between the pair of first sides of the parallelogram in the a-axis direction is larger than an interval between the pair of second sides in the m-axis direction.

4. A semiconductor light-emitting device, comprising:
   a support substrate that has a c-axis facing in a thickness direction and includes a III-V compound semiconductor including Ga and N and having a wurtzite structure;
   mask patterns formed on the support substrate so as to be periodically arranged in an a-axis direction and an m-axis direction of the support substrate;
   a base film that epitaxially grows from the support substrate, further grows in a lateral direction, and covers the mask patterns;
   a light emitting structure, formed on the base film, that includes an n-type semiconductor layer and a p-type semiconductor layer, which are made of III-V compound semiconductors including Ga and N;
   wherein a planar shape of each of the mask patterns has edges matching the four sides of a parallelogram that has a pair of first sides tilted by less than 15 degrees with respect to an m-axis of the base film and a pair of second sides tilted by less than 15 degrees with respect to an a-axis of the base film, and
   wherein an interval between the pair of first sides of the parallelogram in the a-axis direction is larger than an interval between the pair of second sides in the m-axis direction.

5. A method of fabricating a semiconductor light-emitting device, comprising the steps of:
   forming a plurality of protrusions on a surface of a substrate by partially etching a surface layer of the substrate, the substrate having a corundum crystal structure, a c-axis of which faces in a thickness direction;
   forming a base film on the surface of the substrate, on which the plurality of protrusions are formed, the base film being made of a III-V compound semiconductor including Ga and N;
   forming a light emitting structure, on the base film, that includes an n-type semiconductor layer and a p-type semiconductor layer, which are made of III-V compound semiconductors including Ga and N;
   wherein when a direction that is tilted by less than 15 degrees with respect to an a-axis of the base film is designated as a first direction and another direction orthogonal to the first direction is designated as a second direction, the protrusions are regularly arranged, in the first direction and the second direction, a planar shape of each protrusion having edges matching the four sides of a quadrangle, the quadrangle having a pair of first sides tilted by less than 15 degrees with respect to an m-axis of the base film and a pair of second sides tilted by less than 15 degrees with respect to the a-axis of the base film, the first sides, which face each other, of quadrangles corresponding to the two adjacent protrusions in the first direction are mutually parallel, and the second sides, which face each other, of the quadrangles corresponding to the two adjacent protrusions in the second direction are mutually parallel, an interval between the two second sides, which face each other, in the m-axis direction being wider than an interval between the two first sides, which face each other, in the a-axis direction.

* * * * *